United States Patent
Hirakawa

(10) Patent No.: US 8,076,588 B2
(45) Date of Patent: Dec. 13, 2011

(54) MULTILAYER WIRING BOARD

(75) Inventor: Eiichi Hirakawa, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 313 days.

(21) Appl. No.: 12/000,730

(22) Filed: Dec. 17, 2007

(65) Prior Publication Data

US 2008/0173469 A1    Jul. 24, 2008

(30) Foreign Application Priority Data

Dec. 19, 2006   (JP) .............................. P.2006-341778

(51) Int. Cl.
*H05K 1/11*   (2006.01)
(52) U.S. Cl. ........................................ 174/261; 361/777
(58) Field of Classification Search .................. 361/794, 361/767–779; 174/260–261
See application file for complete search history.

(56) References Cited

U.S. PATENT DOCUMENTS

| 4,675,789 A | * | 6/1987 | Kuwabara et al. ............. | 361/794 |
| 6,800,814 B2 | * | 10/2004 | Ohsaka ........................ | 174/255 |
| 6,900,992 B2 | * | 5/2005 | Kelly et al. .................... | 361/794 |
| 2006/0200977 A1 | * | 9/2006 | Lauffer et al. ................. | 29/830 |

FOREIGN PATENT DOCUMENTS

| JP | 63-136694 | 6/1988 |
| JP | 07-263869 | 10/1995 |
| JP | 10-041637 | 2/1998 |
| JP | 2001-274553 | 10/2001 |
| JP | 2002-093940 | 3/2002 |
| JP | 2004-140295 | 5/2004 |

* cited by examiner

*Primary Examiner* — Jeremy Norris

(74) *Attorney, Agent, or Firm* — Drinker Biddle & Reath LLP

(57) ABSTRACT

A multilayer wiring board having a structure in which wiring layers 12A to 12D and insulating layers 11A to 11C are alternately arranged, and in which one or plural kinds of wirings selected from a group of a signal wiring 25 having a signal electrode 15, a power supply wiring 26 having a power supply electrode 16, and a ground wiring 27 having a ground electrode 17 are formed on each of the wiring layers 12A to 12D. The signal wiring 25 and the power supply wiring 26 are alternately provided on the insulating layers. Alternatively, the signal wiring 25 and the ground wiring 27 are alternately provided on the insulating layers.

5 Claims, 16 Drawing Sheets

MULTILAYER WIRING BOARD

BACKGROUND OF THE INVENTION

1. Technical Field

The present invention relates to a multilayer circuit board and, more particularly, to a multilayer circuit board in which a signal wiring, a ground wiring, and a power supply wiring are provided at a high density.

2. Related Art

In recent years, with increasing the operating speed of electronic devices, high-frequency use highly-integrated semiconductor elements (hereunder sometimes referred to simply as high-frequency elements), whose operating frequency exceeds 4 GHz, have appeared. Thus, wiring-boards, on which high-frequency elements are mounted, have been required to be less mixed with noises and to excel in high-frequency characteristics. On the other hand, there have been strong demands for miniaturization of electronic devices, on which high-frequency elements are mounted. Accordingly, the wiring board, on which a high-frequency element is mounted, needs to increase the density of wirings provided therein and to reduce the size thereof.

Generally, a wiring board, on which a high-frequency use semiconductor element is mounted, has a multilayer structure. In each of wiring-layers of the multilayer structure, signal wirings, ground wirings, and power supply wirings are formed. (Hereinafter, wiring boards each having a multilayer structure will be referred to as multilayer wiring boards). Electrical inter layer connection is performed using via holes.

To downsize (or reduce the plane area of) a multilayer wiring board of such a configuration, it is necessary to achieve a high density of wirings by making signal wirings, ground wirings, power supply wirings close to one another so as to provide a narrow pitch of the wirings. Additionally, in the case of the multilayer wiring board, on which a high-frequency device is mounted, a high-frequency signal is supplied to the signal wiring. Accordingly, to enhance transmission efficiency, it is necessary to perform matching of the characteristic impedance of the signal wirings by configuring the multilayer wiring board to have, for example, a microstrip line structure or a coplanar structure (see, for instance, Patent Documents 1 and 2).

FIGS. 8A to 10C illustrate an example of such a kind of a related multilayer wiring board. FIGS. 8A, 8B, 9A and 9B illustrate a multilayer wiring board 100A which is a first example of the related multilayer wiring board. FIG. 8A enlargedly illustrates the vicinity of a position, at which a semiconductor chip 101 is mounted, of the multilayer wiring board 100A. FIG. 8B illustrates a cross-section taken along line B1-B1 shown in FIG. 8A (i.e., a cross-section in which the semiconductor chip 101 is mounted).

As illustrated in FIGS. 8A and 8B, the first related multilayer wiring board 100A is configured so that the semiconductor chip 101 is mounted thereon by flip-chip-bonding. Therefore, a signal electrode 115, a power supply electrode 116, and a ground electrode 117, to which bumps 102 provided on the semiconductor chip 101 are connected, are formed on the top surface of the multilayer wiring board 100A. A signal wiring 125 is connected to a signal electrode 115. A power supply wiring 126 is connected to a power supply electrode 116. A ground wiring 127 is connected to a ground electrode 117 (i.e., the power supply wiring 126 and the ground wiring 127 are not shown in FIGS. 8A and 8B).

The multilayer wiring board 100A has a multilayer structure shown in FIGS. 9A and 9B. More specifically, as illustrated in FIG. 9B, the multilayer wiring board 100A has a four-wiring-layer structure including, in order from a top-most layer, the following arranged layers, a first wiring layer 112A, a first insulating layer 111A, a second wiring layer 112B, a second insulating layer 111B, a third wiring layer 112C, a third insulating layer 111C, and a fourth wiring layer 112D.

FIG. 9A illustrates the first wiring layer 112A formed on the first insulating layer 111A. The first wiring layer 112A is configured so that the signal electrode 115, the power supply electrode 116, the ground electrode 117, the signal wiring 125 electrically connected to the signal electrode 115, and the ground wiring 127 electrically connected to the ground electrode 117 are pattern-formed.

FIGS. 10A to 10C illustrate a second related multilayer wiring board 100B. The multilayer wiring board 100B has a three-wiring-layer structure. More specifically, as cross-sectionally illustrated in FIG. 10C, the multilayer wiring board 100B has, in order from a top-most layer, the following arranged layers, that is, a first wiring layer 112A, a first insulating layer 111A, a second wiring layer 112B, a second insulating layer 111B, and a third wiring layer 112C.

FIG. 10A illustrates the first wiring layer 112A. As illustrated in FIG. 10A, the first wiring layer 112A is configured to form a signal wiring 125 between paired ground wirings 127. Thus, the first wiring layer 112A has a coplanar structure.

FIG. 10B illustrates a second wiring layer 112B. As illustrated in FIG. 10B, the second wiring layer 112B has a structure in which a signal wiring 125, a power supply wiring 126, and a ground wiring 127 are mixed.

Thus, a wiring density can be increased by multilayerization of circuit boards to thereby obtain the multilayer wiring boards 100A and 100B. Also, as illustrated in FIG. 9B, between the first wiring layer 112A and the second wiring layer 112B, the signal wiring 125 and the ground wirings 127 of the multilayer wiring board 100A constitute a microstrip line structure. As illustrated in FIG. 10C, between the second wring layer 112B and the third wiring layer 112C, the signal wiring 125 is provided among the ground wiring 127 and the power supply wiring 126. Thus, the multilayer wiring board 100B has a strip line structure. Accordingly, even in the related multilayer wiring boards 100A and 100B, impedance matching is appropriately performed. Consequently, electrical characteristics can be improved.

[Patent Document 1] JP-A-2002-093940
[Patent Document 2] JP-A-2004-140295

DISCLOSURE OF THE INVENTION

Problems to be Solved by the Invention

However, in the case of the related multilayer wiring boards 100A and 100B, the arrangement of electrodes 115, 116, and 117, to which the bumps of the semiconductor chip 101 have been connected, has not particularly been taken into consideration. The arrangement of the electrodes has irregularly been determined according to the design of flip-chips. Consequently, as illustrated in FIG. 9A, the ground wiring 127 cannot extend to the vicinity of each of the signal electrodes 115 to which the bumps 102 are connected. Thus, as illustrated in FIG. 9B, in the vicinity of each of the electrodes 115, the signal wiring 125 adjoins an associated one of the electrodes 115. Accordingly, the related multilayer wiring boards 100A and 100B have problems that crosstalk occurs between the adjacent signal wirings 125, and that the electrical characteristics deteriorate.

Additionally, although each of the wiring layers 112A and 112B of the related multilayer wiring board 100B is illustrated in FIGS. 10A to 10C, it is found by noting the relationship between the first wiring layer 112A and the second wiring layer 112B that the signal wirings 125 may face each other in an up-down direction. Consequently, the related multilayer wiring board 100B has problems that crosstalk and reactance occur between the signal wirings, and that also, the electrical characteristics deteriorate.

SUMMARY OF THE INVENTION

The invention is accomplished in view of the aforementioned problems. An object of the invention is to provide a multilayer wiring board provided with high-density wirings, which is enabled to prevent degradation of electrical characteristics.

Means for Solving the Problems

To solve the aforementioned problems, according to the invention, the following means are taken.

According to a first aspect of the invention, there is provided a multilayer wiring board including:
wiring layers, and
insulating layers,
the wiring layers and the insulating layers being alternately arranged, and
one or plural kinds of wirings selected from a group of a signal wiring having a signal electrode, a ground wiring having a ground electrode and a power supply wiring having a power supply electrode which are formed on each of the wiring layers, wherein
the signal wiring and the power supply wiring are alternately provided on the insulating layers.

According to a second aspect of the invention, there is provided a multilayer wiring board including:
wiring layers, and
insulating layers,
the wiring layers and the insulating layers being alternately arranged, and
one or plural kinds of wirings selected from a group of a signal wiring having a signal electrode, a ground wiring having a ground electrode and a power supply wiring having a power supply electrode which are formed on each of the wiring layers, wherein
the signal wiring and the ground wiring are alternately provided on the insulating layers.

According to a third aspect of the invention, there is provided a multilayer wiring board including:
wiring layers, and
insulating layers,
the wiring layers and the insulating layers being alternately arranged, and
one or plural kinds of wirings selected from a group of a signal wiring having a signal electrode, a ground wiring having a ground electrode and a power supply wiring having a power supply electrode which are formed on each of the wiring layers, wherein
a wiring placed in an arranging direction just above or just below the signal wiring formed on one of a plurality of the arranged wiring layers is the ground wiring or the power supply wiring.

According to a forth aspect of the invention, there is provided the multilayer wiring board according to the first aspect, wherein
a wiring placed in an arranging direction just above or just below the signal wiring formed on one of a plurality of the arranged wiring layers is the ground wiring or the power supply wiring.

According to a fifth aspect of the invention, there is provided the multilayer wiring board according to the second aspect, wherein
a wiring placed in an arranging direction just above or just below the signal wiring formed on one of a plurality of the arranged wiring layers is the ground wiring or the power supply wiring.

According to a sixth aspect of the invention, there is provided a multilayer wiring board including:
wiring layers, and
insulating layers,
the wiring layers and the insulating layers being alternately arranged, and
one or plural kinds of wirings selected from a group of a signal wiring having a signal electrode, a ground wiring having a ground electrode and a power supply wiring having a power supply electrode which are formed on each of the wiring layers, wherein
the signal wiring and the power supply wiring are alternately provided on the insulating layers,
the signal wiring and the ground wiring are alternately provided on the insulating layers, and
a wiring placed in an arranging direction just above or just below the signal wiring formed on one of a plurality of the arranged wiring layers is the ground wiring or the power supply wiring.

EFFECTS OF THE INVENTION

According to the invention, even in the vicinity of each of the signal pads, the ground pads, and the power supply pads, the signal wiring constitutes, together with the ground wirings and the power supply wirings, a strip line structure, a microstrip line structure, or a coplanar structure is constituted. Thus, impedance matching can be achieved. Crosstalk can be suppressed from occurring between the signal wirings. Consequently, even in the case of a multilayer wiring board provided with high-density wirings, electrical characteristics can be improved.

BRIEF DESCRIPTION OF THE DRAWINGS

FIG. 1
FIGS. 1A to 1C are views illustrating a multilayer wiring board according to a first embodiment of the invention.
FIG. 1A is a view illustrating a first wiring layer.
FIG. 1B is a view illustrating a second wiring layer.
FIG. 1C is a cross-sectional view illustrating a multilayer wiring board (i.e., a cross-sectional view taken along line A1-A1 shown in FIG. 1A).
FIG. 2
FIGS. 2A to 2D are views illustrating a multilayer wiring board according to a second embodiment of the invention.
FIG. 2A is a view illustrating a first wiring layer.
FIG. 2B is a view illustrating a second wiring layer.
FIG. 2C is a view illustrating a third wiring layer beard.
FIG. 2D is a cross-sectional view illustrating a multilayer wiring board (i.e., a cross-sectional view taken along line A2-A2 shown in FIG. 2A).
FIG. 3
FIGS. 3A to 3D are views illustrating a multilayer wiring board according to a third embodiment of the invention.
FIG. 3A is a plan view illustrating the multilayer wiring board according to the third embodiment of the invention.
FIG. 3B is a view illustrating a first wiring layer.
FIG. 3C is a view illustrating a second wiring layer.
FIG. 3D is a view illustrating a third wiring layer.

FIG. 4

FIG. 4A is a plan view illustrating the multilayer wiring board according to the fourth embodiment of the invention. FIG. 4B is a view illustrating a first wiring layer. FIG. 4C is a view illustrating a second wiring layer. FIG. 4D is a view illustrating a third wiring layer.

FIG. 5

FIG. 5A is a plan view illustrating the multilayer wiring board according to the fifth embodiment of the invention. FIG. 5B is a view illustrating a first wiring layer. FIG. 5C is a view illustrating a second wiring layer. FIG. 5D is a view illustrating a third wiring layer.

FIG. 6

FIG. 6A is a plan view illustrating the multilayer wiring board according to the sixth embodiment of the invention. FIG. 6B is a view illustrating a first wiring layer.

FIG. 7

FIG. 7A is a plan view illustrating the multilayer wiring board according to the seventh embodiment of the invention. FIG. 7B is a view illustrating a first wiring layer. FIG. 7C is a view illustrating a second wiring layer. FIG. 7D is a view illustrating a third wiring layer.

FIG. 8

FIG. 8A is an enlarged plan view illustrating the vicinity of a position at which a semiconductor chip is mounted. FIG. 8B is a cross-sectional view (taken on line B1-B1 shown in FIG. 8A).

FIG. 9

FIG. 9A is a view illustrating a first wiring layer. FIG. 9B is a cross-sectional view illustrating the multilayer wiring board (i.e., a cross-sectional view taken along line B2-B2 shown in FIG. 9A).

FIG. 10

FIG. 10A is a view illustrating a first wiring layer. FIG. 10B is a view illustrating a second wiring layer. FIG. 10C is a cross-sectional view illustrating the multilayer wiring board (i.e., a cross-sectional view taken along line B3-B3 shown in FIG. 10A).

DETAILED DESCRIPTION OF THE PREFERRED EMBODIMENTS

Best Mode for Carrying Out the Invention

Next, a best mode for carrying out the invention is described below with reference to the accompanying drawings.

Figure 1A:
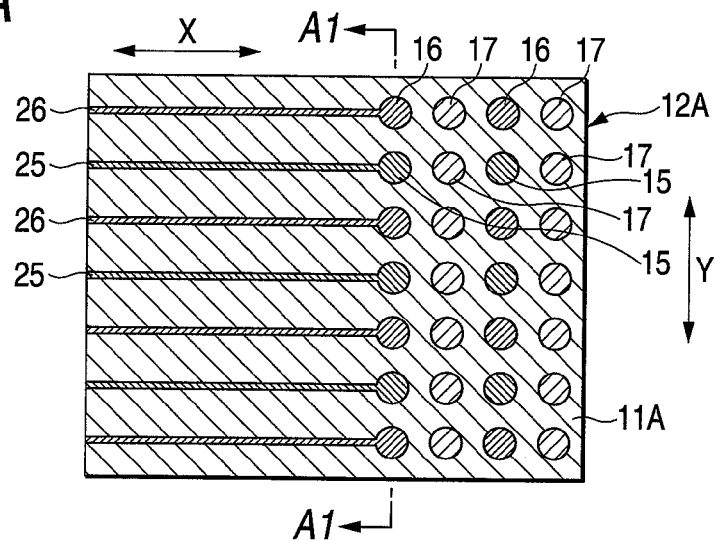
FIGS. 1A to 1C are views illustrating a multilayer wiring
Figure 1B:
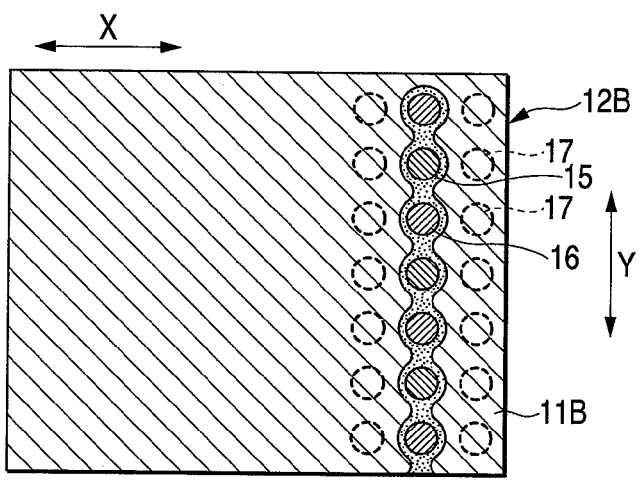
Figure 1C:
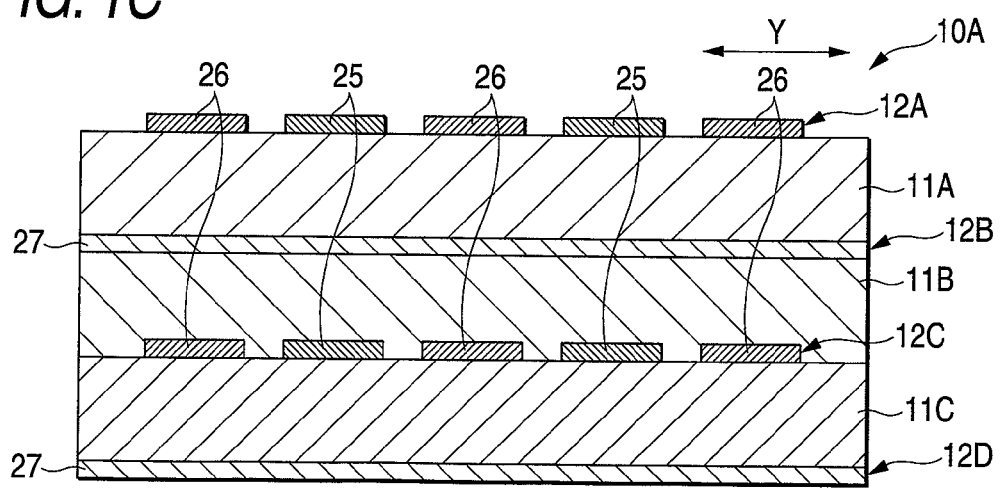
Figure 8A:
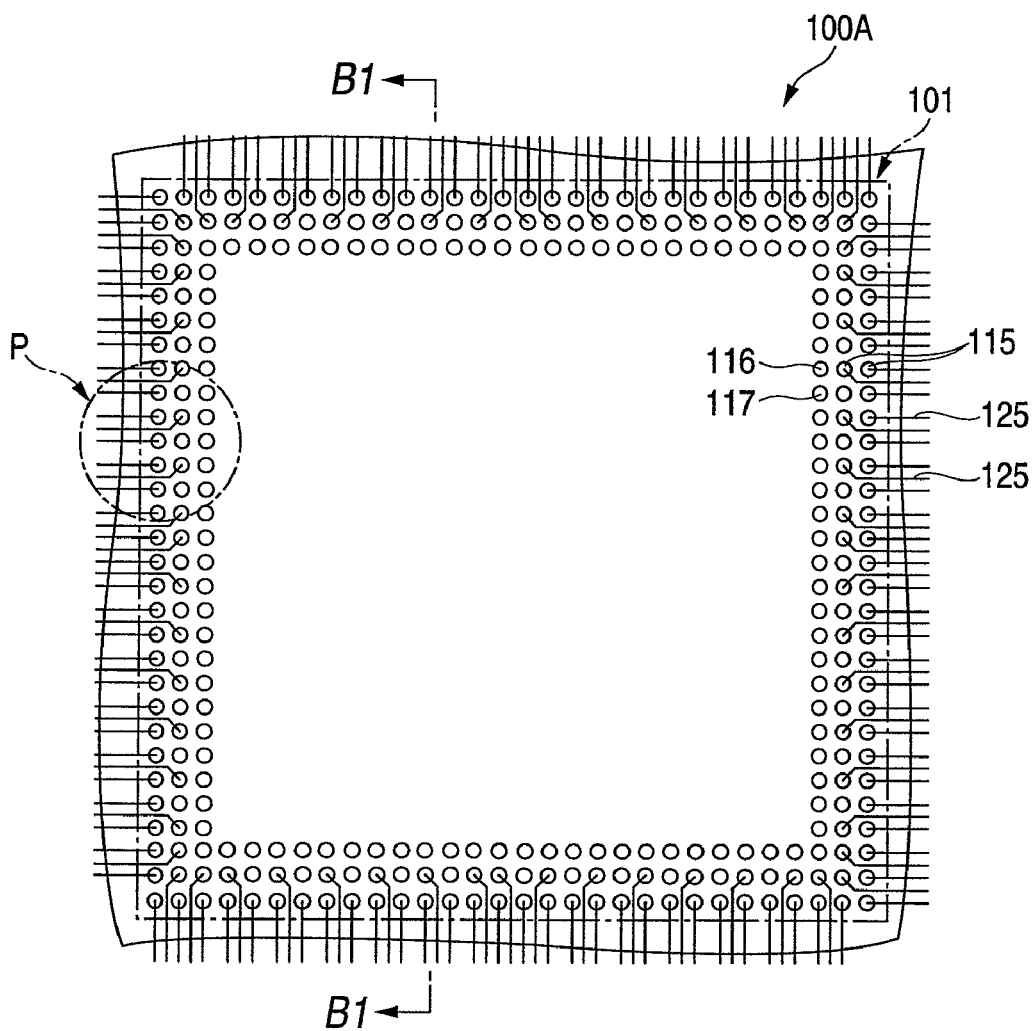
FIGS. 8A and 8B are views illustrating a first related multilayer wiring board.
Figure 8B:
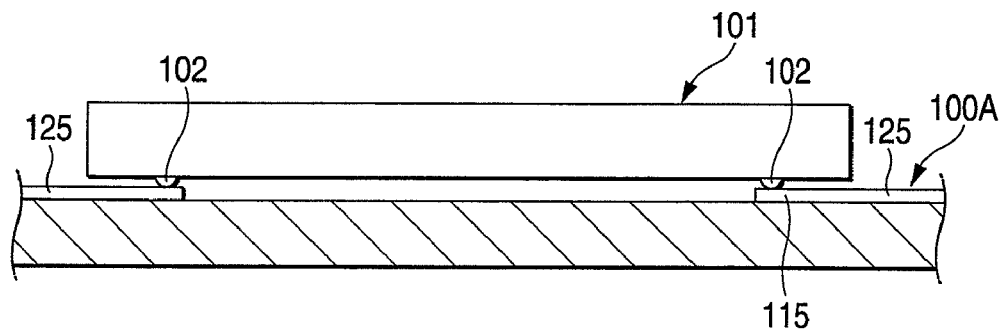
Figure 9A:
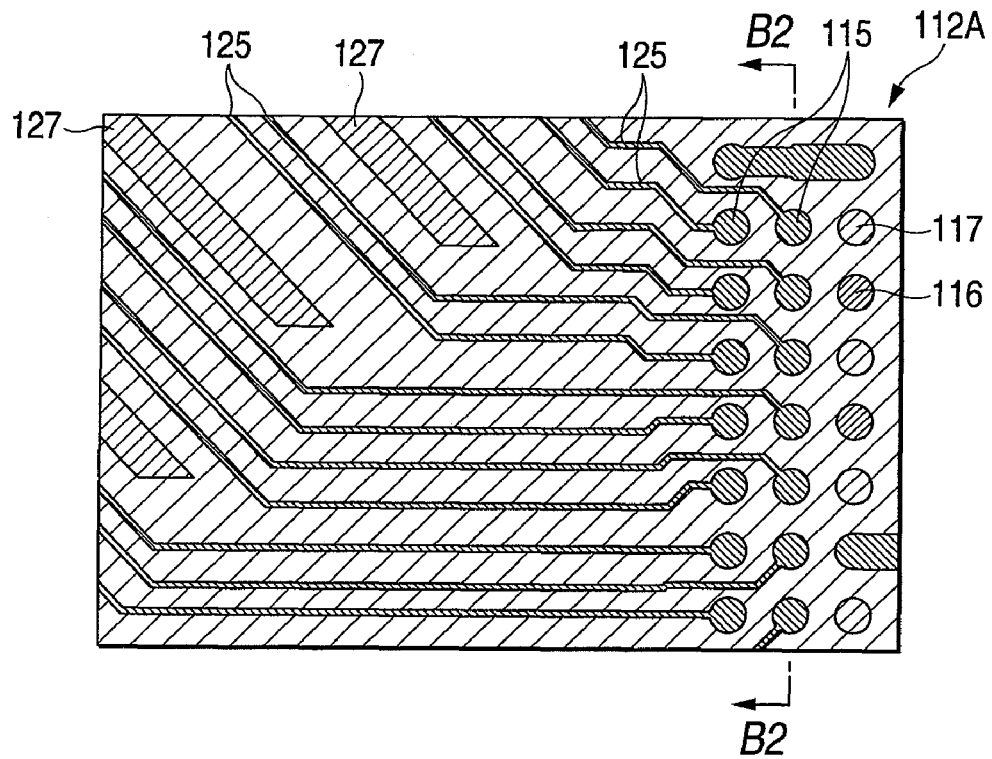
FIGS. 9A and 9B are views illustrating the first related multilayer wiring board.
Figure 9B:
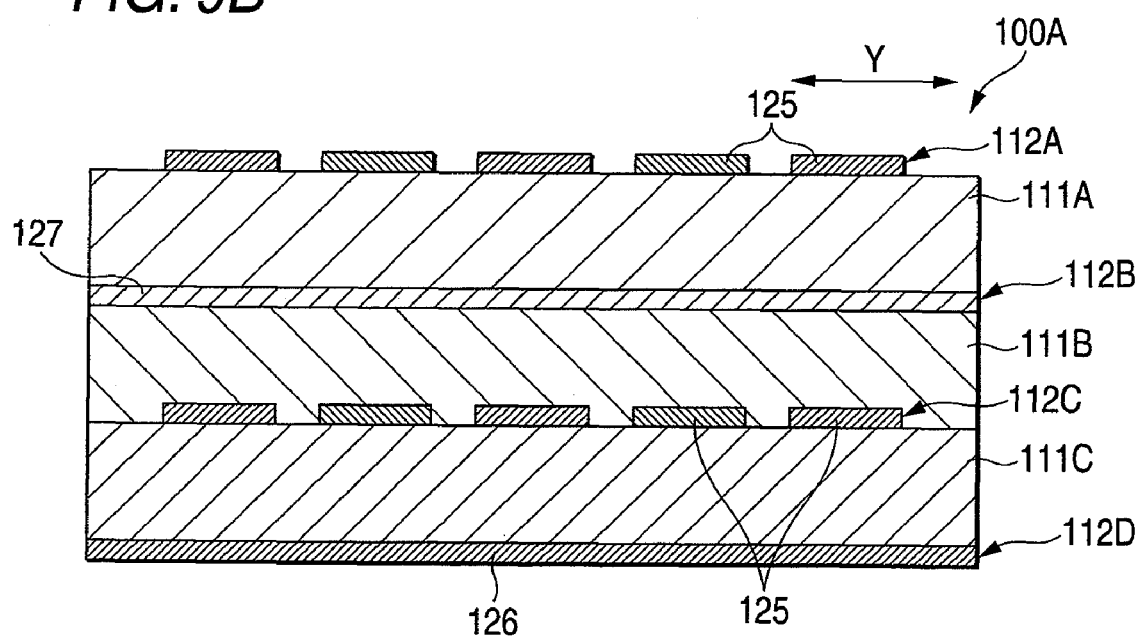
Figure 10A:
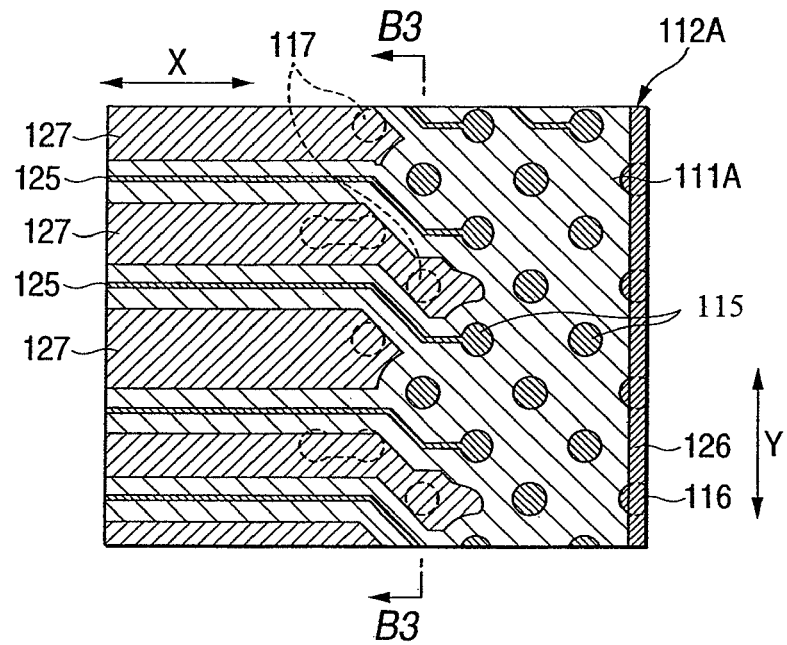
FIGS. 10A, 10B, and 10C are views illustrating a second related multilayer wiring board.
Figure 10B:
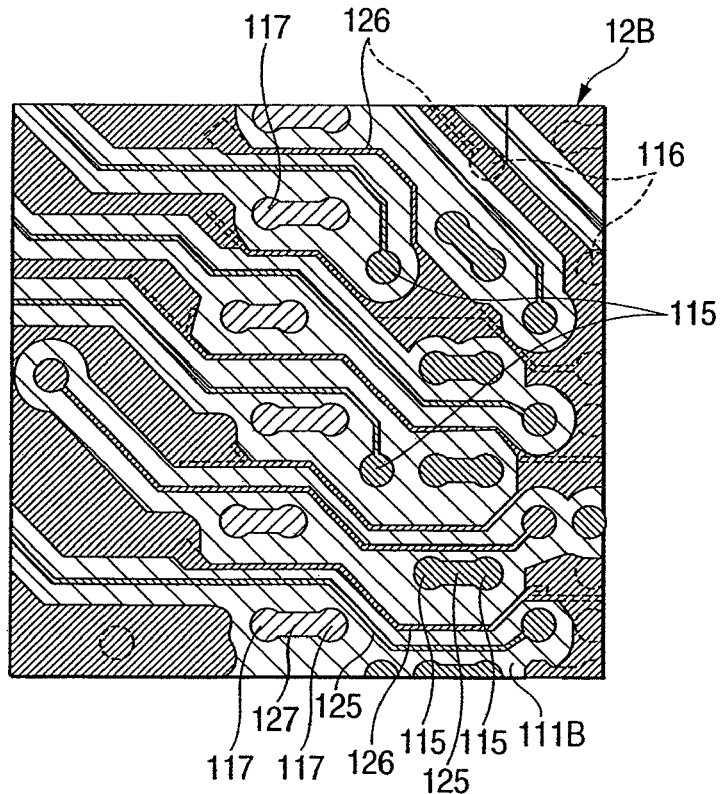
Figure 10C:
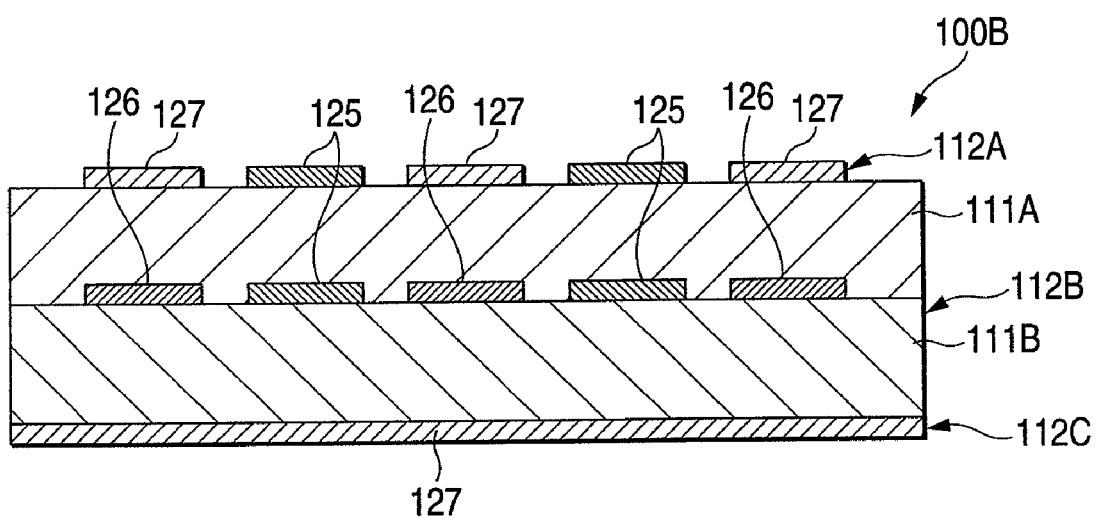

FIGS. 1A to 1C are views illustrating a multilayer wiring board 10A according to a first embodiment of the invention. The invention features the inner structure of the multilayer wiring board 10A. The external appearance of the multilayer wiring board 10A only slightly differs from that of the related multilayer wiring board illustrated in FIGS. 8A and 8B. Therefore, the illustration of the multilayer wiring board 10A is omitted.

FIGS. 1A and 1B enlargedly illustrate the vicinity of a position, at which a semiconductor chip 101 is mounted, of the multilayer wiring board 10A. A part illustrated in this figure corresponds to a region indicated by arrow P shown in FIG. 8A. FIG. 1A illustrates a first wiring layer 12A of the multilayer wiring board 10A. FIG. 1B illustrates a second wiring board 12B. FIG. 1C illustrates a cross-section taken along line A1-A1 shown in FIG. 1A.

The multilayer wiring board 10A has a multilayer structure, as illustrated in FIG. 1C. More specifically, the multilayer wiring board 10A has a four-wiring-layer structure that has the following arranged layers including, in order from a top-most layer, a first wiring layer 12A, a first insulating layer 11A, a second wiring layer 12B, a second insulating layer 11B, a third wiring layer 12C, and a fourth wiring layer 12D.

The multilayer wiring board 10A is configured so that the semiconductor chip 101 (see FIGS. 8A and 8B) is mounted thereon by flip-chip connection. Accordingly, plural signal electrodes 15, plural power supply electrodes 16, and plural ground electrodes 17, which are connected to bumps 102 provided on the semiconductor chip 101, are regularly formed on the first wiring layer 12A which is the top-most layer of the multilayer wiring board 10A. As illustrated in FIG. 1C, the first wiring layer 12A is formed on the first insulating layer 11A.

A plurality of electrodes 15 to 17 are formed on the first wiring layer 12A. The ground electrodes 17 are formed on an innermost side of the first wiring layer 12A (in the following description, sometimes, these electrodes 17 are referred to as innermost peripheral electrodes). In each of FIGS. 1A and 1B, a right side corresponds to an inner side, while a left side corresponds to an outer side (see the region indicated by arrow P shown in FIG. 8A).

The signal electrode 15 and the power supply electrode 16 (in the following description, these electrodes 15 and 16 are sometimes referred to as one-column-outer electrodes) are alternately formed on the second-innermost peripheral column extending outwardly from the innermost peripheral electrode 17 in a direction (hereunder referred to as an orthogonal direction (i.e., an up-down direction indicated by arrow Y in each of FIGS. 1A and 1B)) perpendicular to a lateral direction (hereunder referred to as an internal/external direction (indicated by arrow X in each of FIGS. 1A and 1B)) in each of these figures.

Also, the ground electrodes 17 (in the following description, the electrode 17 will be sometimes referred to as a two-column-outer electrode) are formed on the third-innermost peripheral column extending outwardly from the innermost peripheral column. Additionally, the signal electrode 15 and the power supply electrode 16 (in the following description, these electrode 15 and 16 will be sometimes referred to as three-column-outer electrode) are alternately formed on the fourth-innermost peripheral column in the orthogonal direction (i.e., Y-direction), which extends outwardly from the innermost peripheral electrode 17.

Incidentally, the plural electrodes 15 to 17 formed on the first wiring layer 12A are electrically connected to the wiring layers formed on an under layer of the first wiring layer 12A through via holes. Thus, the electrodes of the same kind (i.e., the signal electrodes, the power supply electrodes, or the ground electrodes) are placed in the arranging direction.

That is, only the signal wiring 25 and the power supply wiring 26 respectively connected to the signal electrode 15 and the power supply electrode 16, which are the three-column-outer electrodes, are formed on the first wiring layer 12A formed on the first insulating layer 11A. As described above, the signal electrode 15 and the power supply electrode 16, which are the three-column-outer electrodes, are alternately formed in the orthogonal direction (i.e., Y-direction). Thus, the signal wiring 25 and the power supply wiring 26, which are connected to the signal electrode 15 and the power supply electrode 16, are alternately formed.

Therefore, the power supply wiring 26 is necessarily interposed between the paired adjacent signal wirings 25 formed on the first wiring layer 12A. Accordingly, the first wiring layer 12A has a coplanar structure, so that impedance matching can be achieved. Additionally, the paired adjacent signal wirings 25 do not directly adjoin each other. Consequently, occurrence of crosstalk can be suppressed. Thus, with the configuration according to the present embodiment, the electrical characteristics of the first wiring layer 12A can be improved.

Incidentally, the innermost peripheral electrode 17, the one-column-outer electrodes 15 and 16, and the two-column-outer electrode 17 are electrically connected to the electrodes formed on the under layer through via holes.

FIG. 1B illustrates the second wiring layer 12B. As illustrated in FIG. 1C, the second wiring layer 12B is formed on the second insulating layer 11B. In the present embodiment, the second wiring layer 12B is a plane layer for which the ground wiring 27 is provided.

The electrodes 15 and 16 serving as the two-column-outer electrodes formed on the second wiring layer 12B are insulated from the ground wiring 27. The innermost electrode 17 and the two-column-outer electrode 17 formed on the first wiring layer 12A are connected to the ground wiring 27 formed on the second wiring layer 12B, which are formed integrally with the ground wiring 27.

Focusing attention on the first wiring layer 12A and the second wiring layer 12B, the second wiring layer 12B constitutes a plane layer which is the under layer of the first wiring layer 12A. Thus, the first wiring layer 12A and the second wiring layer 12B constitute a microstrip line structure, so that the impedance matching of the signal wiring 25 can be performed. Consequently, the electric characteristics of the first wiring layer 12A can be improved.

The third wiring layer 12C has signal electrodes 15 and power supply electrodes 16 alternately formed in the orthogonal direction (i.e., Y-direction). Thus, the wirings 25 and 26 respectively connected to the signal electrode 15 and the power supply electrode 16 are alternately formed in the orthogonal direction (i.e., Y-direction).

Thus, even in the third wiring board 12C, the power supply wiring 26 necessarily intervenes between the paired adjacent signal wirings 25, similarly to the first wiring layer 12A. Consequently, impedance matching can be achieved. Also, crosstalk can be suppressed. The electric characteristics of the third wiring layer 12C can be improved.

Also, the fourth wiring layer 12D has substantially the same configuration as that of the second wiring layer 12B. That is, the fourth wiring layer 12D is formed as a plane layer for which the ground wiring 27 is provided. The fourth wiring layer 12D is connected to the innermost peripheral electrode 17 of each of the wiring layers 12A to 12C through the via-hole.

Accordingly, the third wiring layer 12C including the signal electrodes 15 has a strip line structure, which is placed between the second wiring layer 12B and the fourth wiring layer 12D. Consequently, the impedance matching of the signal wiring 25 can be achieved. Also, the electric characteristics of the third wiring layer 12C can be improved.

Thus, in accordance with the multilayer wiring board 10A according to the present embodiment, even in the vicinity of the signal electrode 15, the power supply electrode 16, and the ground electrode 17, the signal wiring 25 constitutes, together with the power supply wirings 26 or the ground wirings 27, a strip line structure, a microstrip line structure, or a coplanar structure. Consequently, impedance matching can be achieved. Also, crosstalk can be suppressed from occurring between the signal wirings. Accordingly, even in the case of a multilayer wiring board 10A provided with high-density wirings, electric characteristics can be improved.

Next, other embodiments according to the invention are described below with reference to FIGS. 2A to 7D. Incidentally, in FIGS. 2A to 7D, like reference numerals designate components corresponding to those illustrated in FIGS. 1A to 1C. Thus, the description of such components is omitted.

Figure 2A:
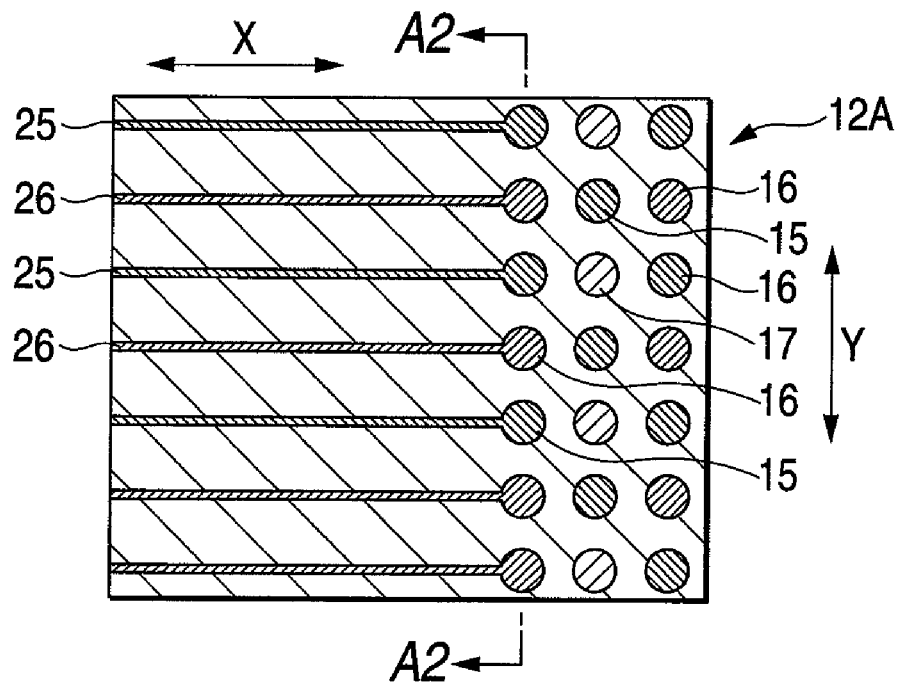
Figure 2B:
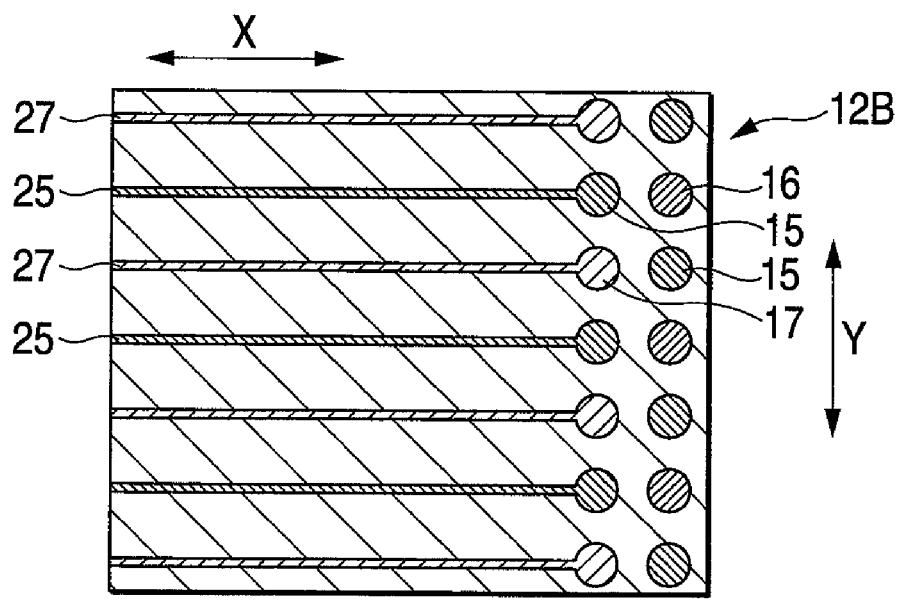
Figure 2C:
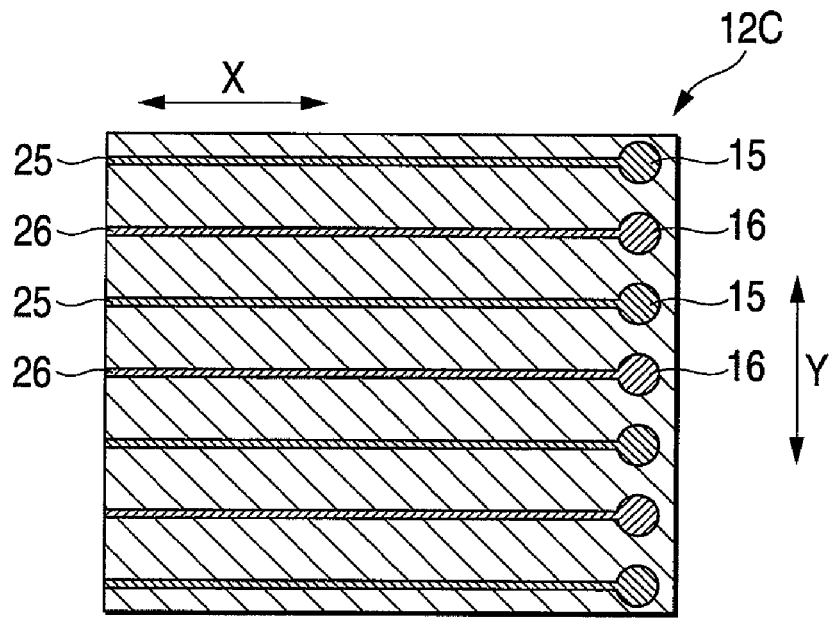
Figure 2D:
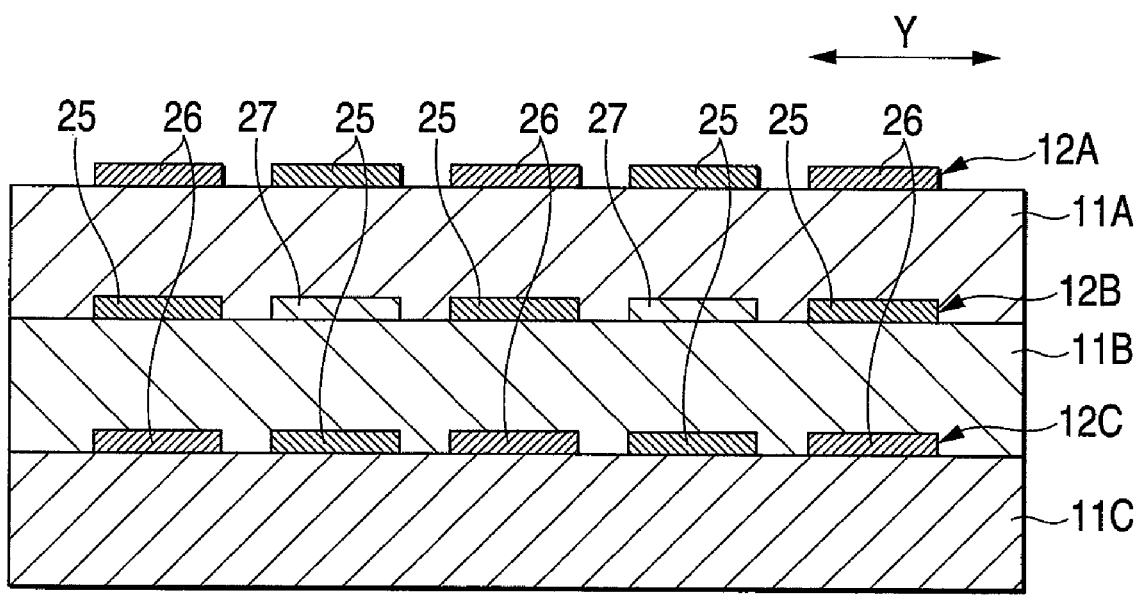

FIGS. 2A to 2D illustrate a multilayer wiring board 10B according to a second embodiment of the invention. FIG. 2A illustrates a first wiring layer 12A. FIG. 2B illustrates a second wiring layer 12B. FIG. 2C is a view illustrating a third wiring layer 12C. FIG. 2D illustrates a cross-section taken along line A2-A2 shown in FIG. 2A.

In the case of the multilayer wiring board 10B according to the present embodiment, the innermost peripheral electrode, the one-column-outer electrode, and the two-column-outer electrode are formed on the first wiring layer 12A serving as the topmost layer. The innermost peripheral electrodes include the signal electrodes 15 and the power supply electrodes 16. The signal electrode 15 and the power supply electrode 16 are alternately formed in the aforementioned orthogonal direction (i.e., Y-direction).

The one-column-outer electrodes include the signal electrodes 15 and the ground electrodes 17. The signal electrode 15 and the ground electrode 17 are alternately formed in the orthogonal direction (i.e., Y-direction). Further, the two-column-outer electrodes include the signal electrodes 15 and the power supply electrodes 16. The signal electrode 15 and the power supply electrode 16 are alternately formed in the orthogonal direction (i.e., Y-direction).

On the other hand, focusing attention on the internal/external direction (i.e., X-direction), there are a first group, which includes the signal electrode 15, the ground electrode 17, and the signal electrode 15 in order from the inner-side, and a second group including, in order from the inner-side, the power supply electrode 16, the signal electrode 15, and the power supply electrode 16. Further, the first group and the second group are alternately formed in the orthogonal direction (i.e., Y-direction). Thus, even in the present embodiment, the electrodes 15 to 17 are regularly formed in a predetermined order.

Additionally, in the case of the first wiring layer 12A, the signal wirings 25 and the power supply wirings 26 are connected only to the signal electrodes 15 and the power supply electrodes 16 included in the two-column-outer electrodes. Accordingly, the signal wiring 25 and the power supply wiring 26 are alternately formed in the orthogonal direction (i.e., Y-direction).

FIG. 2B illustrates the second wiring layer 12B. As illustrated in FIG. 2D, the second wiring layer 12B is formed on the second insulating layer 11B.

The second wiring layer 12B has the innermost peripheral electrodes and the one-column-outer electrodes. The innermost peripheral electrodes include the signal electrodes 15 and the power supply electrodes 16. The one-column-outer electrodes include the signal electrodes 15 and the ground electrodes 17.

Additionally, in the case of the second wiring layer 12B, the signal wirings 25 and the ground wirings 27 are connected only to the signal electrodes 15 and the ground electrodes 17 included in the one-column-outer electrodes. Accordingly, on the third wiring layer 12C, the signal wiring 25 and the ground wiring 27 are alternately formed in the orthogonal direction (i.e., Y-direction).

FIG. 2C illustrates the third wiring layer 12C. As illustrated in FIG. 2D, the third wiring layer 12C is formed on the third insulating layer 11C.

The third wiring layer 12C has only the innermost peripheral electrodes. The innermost peripheral electrodes include the signal electrodes 15 and the power supply electrodes 16. The signal wirings 25 and the power supply wirings 26 are connected only to the signal electrodes 15 and the ground electrodes 17 included in the innermost peripheral electrodes of the third wiring layer 12C. Accordingly, the signal wiring 25 and the power supply electrode 26 are alternately formed in the orthogonal direction (i.e., Y-direction).

As described above, in the multilayer wiring board 10B according to the present embodiment, the signal wiring 25 is placed between the paired power supply wirings 26 or the paired ground wirings 27 on each of the first to third wiring layers 12A to 12C. Thus, the multilayer wiring board 10B has coplanar structures.

Focusing attention on the arranging direction, as illustrated in FIG. 2D, the wiring placed just above or just under the signal wiring 25 is the power supply wiring 26 or the ground wiring 27. Therefore, the signal wirings 25 do not face each other in the arranging direction. This is because of the facts that the positions of the signal electrodes 15 included in the innermost peripheral electrodes, those of the signal electrodes 15 included in the one-column-outer electrodes, and those of the signal electrodes 15 included in the two-column-outer electrodes are in a stagger arrangement, and that the signal electrodes 15 of each of the wiring layers 12A to 12C are not arranged in the internal/external direction (i.e., X-direction).

With the aforementioned configuration, even in the case of the multilayer wiring board 10B according to the present embodiment, impedance matching can be achieved. Also, crosstalk can be suppressed from occurring between the signal wirings. Accordingly, even in the case of the multilayer wiring board 10B provided with high-density wirings, electric characteristics can be improved.

Figure 3A:
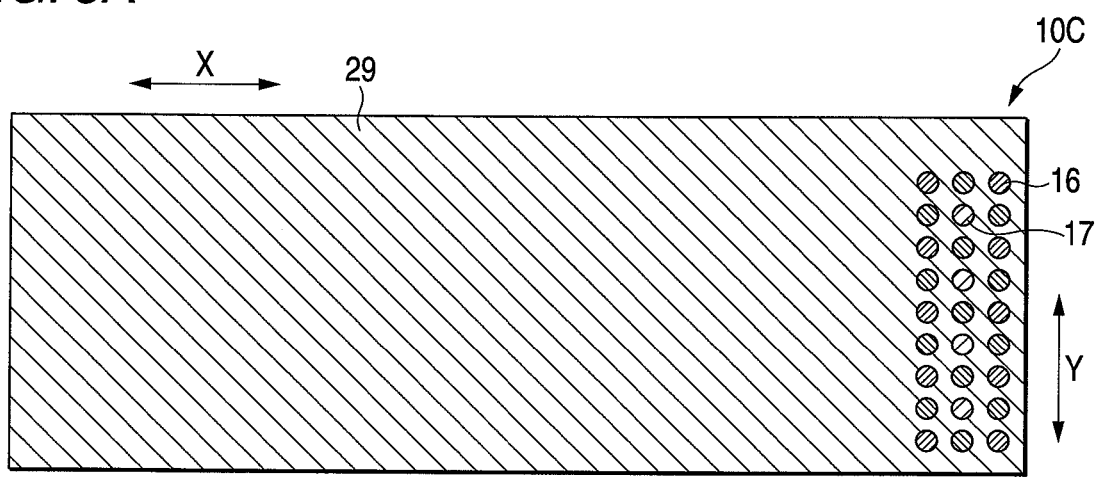

FIGS. 3A to 3D illustrate a multilayer wiring board 10C according to a third embodiment of the invention. FIG. 3A is a plan view illustrating the multilayer wiring board 10C according to the third embodiment of the invention. As illustrated in FIG. 3A, in the multilayer wiring board 10C, the electrodes 15 to 17 connected to the semiconductor chip 101 are formed on the top surface of the first wiring layer 12A. Other parts are coated with a solder resist 29.

Figure 3B:
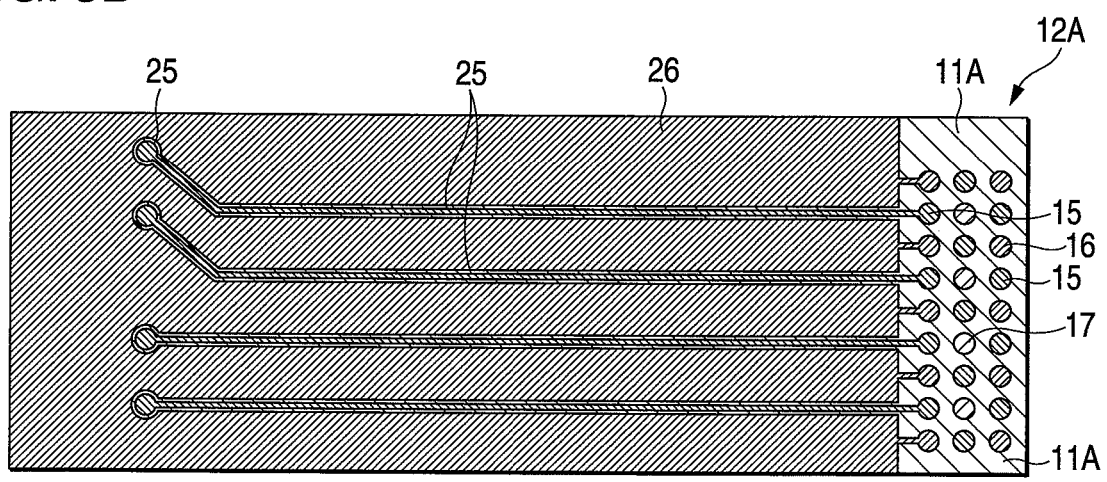

FIG. 3B illustrates a first wiring layer 12A that is a topmost layer. The innermost peripheral electrodes, the one-column-outer electrodes, and the two-column-outer electrodes are formed on the first wiring layer 12A.

The innermost peripheral electrodes include the signal electrodes 15 and the power supply electrodes 16. The signal electrode 15 and the power supply electrode 16 are alternately formed in the orthogonal direction (i.e., Y-direction) thereon.

The one-column-outer electrodes include the signal electrodes 15 and the ground electrodes 17. The electrodes 15 and 17 are alternately formed in the orthogonal direction (i.e., Y-direction). The two-column-outer electrodes include the signal electrodes 15 and the power supply electrodes 16. The signal electrode 15 and the power supply electrode 16 are alternately formed in the orthogonal direction (i.e., Y-direction). Additionally, the electrodes are formed so that the positions of the signal electrodes 15 included by the innermost peripheral electrodes, those of the signal electrodes 15 included by the one-column-outer electrodes, and those of the signal electrodes 15 included by the two-column-outer electrodes are in a stagger arrangement, and that the signal electrodes 15 of each of the wiring layers are not arranged in the internal/external direction (i.e., X-direction).

In the case of the first wiring layer 12A, the signal wirings 25 and the power supply wirings 26 are connected only to the signal electrodes 15 and the power supply electrodes 16 included by the two-column-outer electrodes. In the present embodiment, a plane layer, for which the power supply wirings 26 are provided, is formed. The signal wiring 25 is formed in an insulating area (i.e., a part from which the first insulating layer 11A is exposed) formed in the plane layer, for which the power supply wirings 26 are provided. Thus, the signal wiring 25 is insulated from the power supply wiring 26. Consequently, even in the case of forming a plane layer for which the power supply wirings 26 are provided, the signal wiring 25 and the power supply wiring 26 are substantially alternately formed in the orthogonal direction (i.e., Y-direction).

Figure 3C:
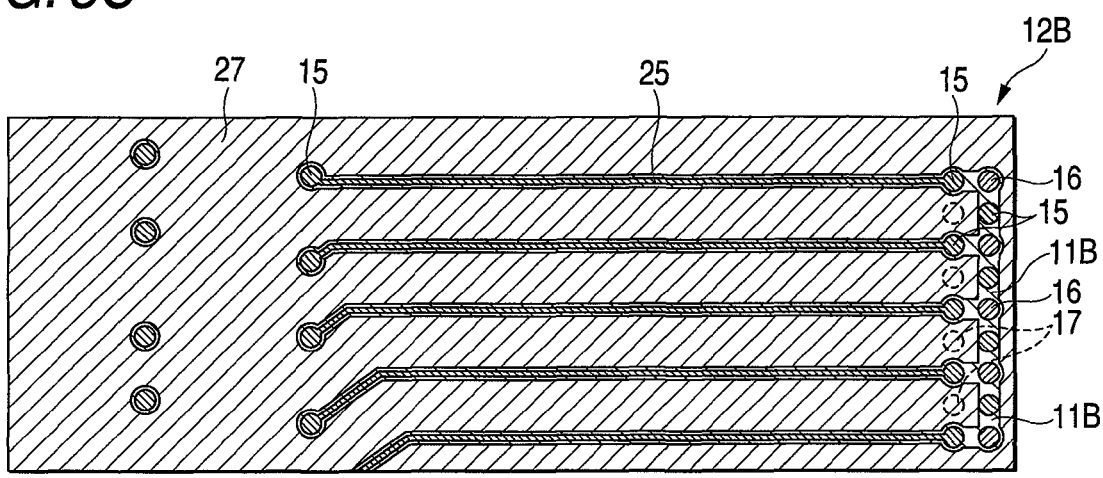

FIG. 3C illustrates a second wiring layer 12B. The second wiring layer 12B includes the innermost peripheral electrodes and the one-column-outer electrodes. The innermost peripheral electrodes include the signal electrodes 15 and the power supply electrodes 16. The one-column-outer electrodes include the signal electrodes 15 and the ground electrodes 17.

The signal wirings 25 and the ground wirings 27 are connected only to the signal electrodes 15 and the ground electrodes 17 included by the one-column-outer electrodes on the second wiring layer 12B. Additionally, a plane layer, for which the ground wiring 27 is provided, is formed therein. Accordingly, in the second wiring layer 12B, the signal wirings 25 and the ground wirings 27 are substantially alternately formed in the orthogonal direction (i.e., Y-direction).

Figure 3D:
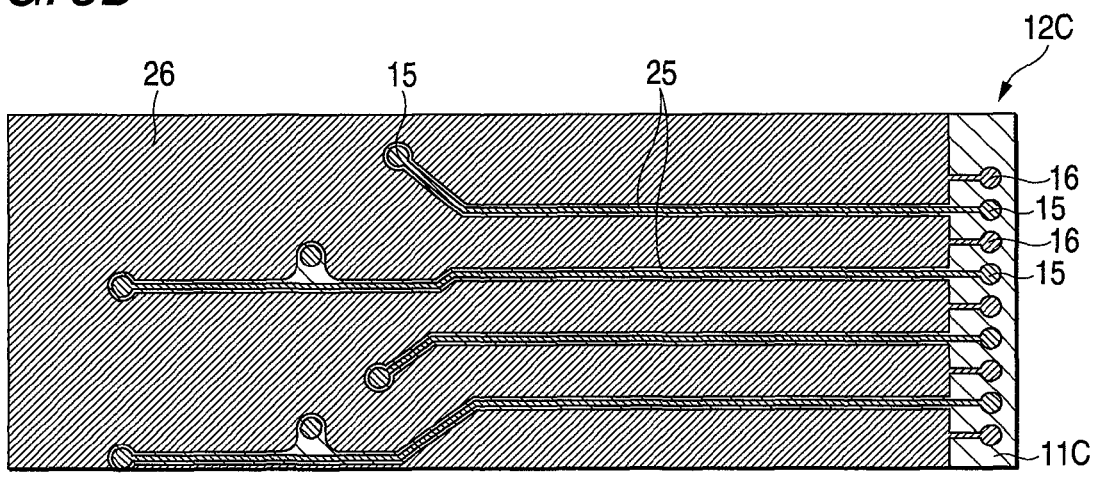

FIG. 3D illustrates a third wiring layer 12C. The third wiring layer 12C includes only the innermost peripheral electrodes. The innermost peripheral electrodes include the signal electrodes 15 and the power supply electrodes 16. The signal wirings 25 and the power supply wirings 26 are connected only to the signal electrodes 15 and the power supply electrodes 16. Additionally, a plane layer, for which the power supply wiring 26 is provided, is formed therein. Therefore, the signal wiring 25 and the power supply wiring 26 are substantially alternately formed in the orthogonal direction (i.e., Y-direction) therein.

As described above, in the multilayer wiring board 10C according to the present embodiment, the signal wiring 25 is placed between the paired power supply wirings 26 or the paired ground wirings 27 on each of the first to third wiring layers 12A to 12C. Thus, the multilayer wiring board 10C has coplanar structures. Additionally, the positions of the signal electrodes 15 included by the innermost peripheral electrodes, those of the signal electrodes 15 included by the one-column-outer electrodes, and those of the signal electrodes 15 included by the two-column-outer electrodes are in a stagger arrangement. Consequently, the wiring placed just above or just under the signal wiring 25 is the power supply wiring 26 or the ground wiring 27, similarly to the second embodiment.

Consequently, even in the case of the multilayer wiring board 10C according to the present embodiment, impedance matching can be achieved. Also, crosstalk can be suppressed from occurring between the signal wirings. Accordingly, even in the case of the multilayer wiring board 10C provided with high-density wirings, electric characteristics can be improved.

Figure 4A:
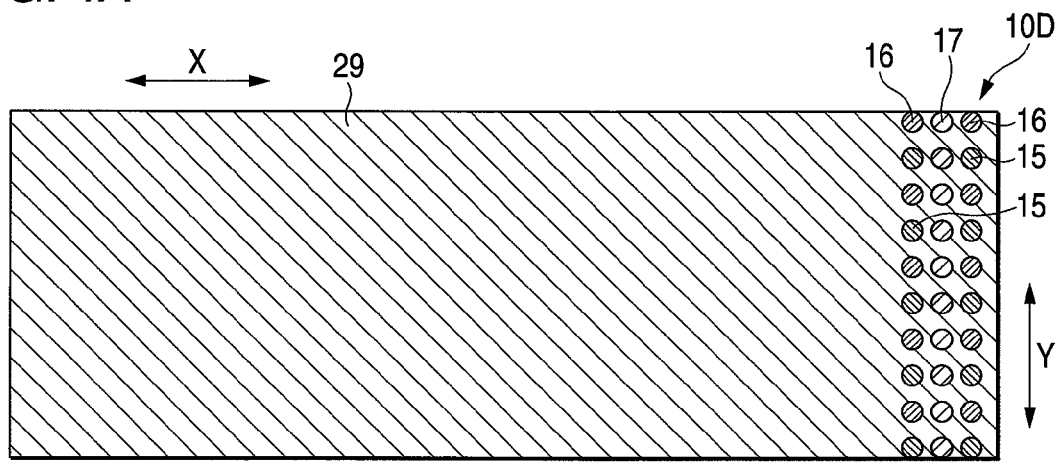
FIGS. 4A to 4D are views illustrating a multilayer wiring board according to a fourth embodiment of the invention.

FIGS. 4A to 4D illustrate a multilayer wiring board 10D that is a fourth embodiment of the invention. FIG. 4A is a plan view illustrating the multilayer wiring board 10D. As illustrated in FIG. 4A, in the multilayer wiring board 10D, the electrodes 15 to 17 connected to the semiconductor chip 101 are formed on the top surface of the first wiring layer 12A. Other parts are coated with the solder resist 29.

Figure 4B:
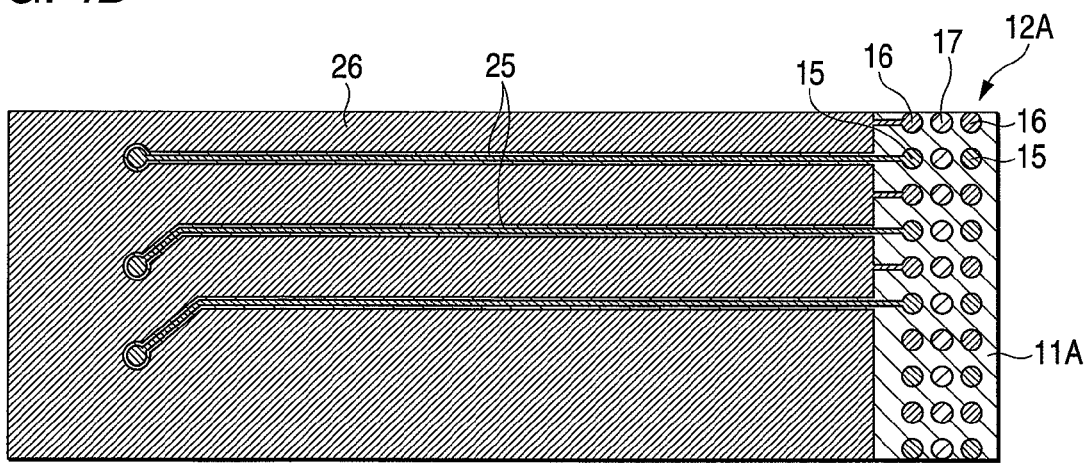

FIG. 4B illustrates a first wiring board 12A that is a topmost layer. The innermost peripheral electrodes, the one-column-outer electrodes, and the two-column-outer electrodes are formed on the first wiring layer 12A.

The innermost peripheral electrodes include the signal electrodes 15 and the power supply electrodes 16. The signal electrode 15 and the power supply electrode 16 are alternately formed in the orthogonal direction (i.e., Y-direction) thereon. The one-column-outer electrodes include only the ground electrodes 17. Further, the two-column-outer electrodes include the signal electrodes 15 and the power supply electrodes 16. The signal electrode 15 and the power supply electrode 16 are alternately formed in the orthogonal direction (i.e., Y-direction).

In the case of the first wiring layer 12A, the signal wirings 25 and the power supply wirings 26 are connected only to the signal electrodes 15 and the power supply electrodes 16 included by the two-column-outer electrodes. In the present embodiment, a plane layer, for which the power supply wirings 26 are provided, is formed. Consequently, the signal wiring 25 and the power supply wiring 26 are substantially alternately formed in the orthogonal direction (i.e., Y-direction).

Figure 4C:
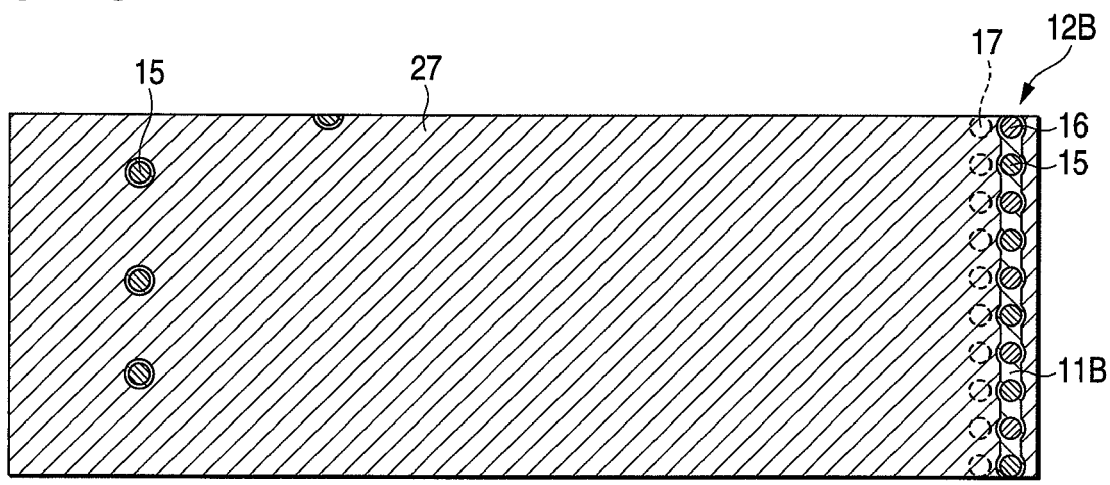

FIG. 4C illustrates the second wiring layer 12B. The second wiring layer 12B includes only the ground wiring 27. Incidentally, a plane layer, for which the ground wiring 27 is provided, is formed. The signal electrodes 15 and the power supply electrodes 16, which serve as the innermost peripheral electrodes, are insulated from the ground electrodes 17 only on a part from which the second insulating layer 11B is exposed.

Figure 4D:
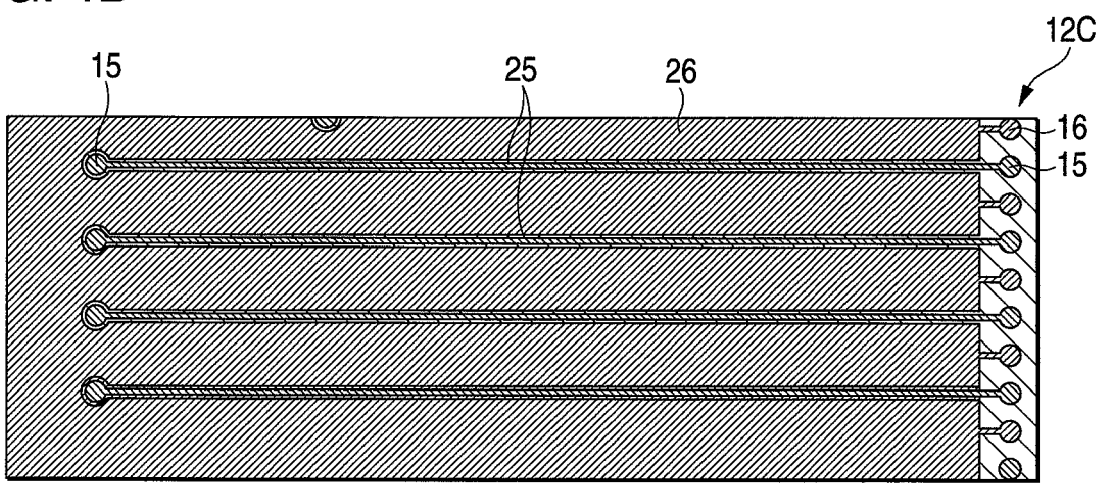

FIG. 4D illustrates the third wiring layer 12C. The third wiring layer 12C includes only the innermost peripheral electrodes. The innermost peripheral electrodes include the signal electrodes 15 and the power supply electrodes 16. The signal wirings 25 and the power supply wirings 26 are connected only to the signal electrodes 15 and the power supply electrodes 16. Further, a plane layer, for which the power supply wiring 26 is provided, is formed therein. Accordingly, in the third wiring layer 12C, the signal wiring 25 and the power supply wiring 26 are substantially alternately formed in the orthogonal direction (i.e., Y-direction).

As described above, in each of the first wiring layer 12A and the third wiring layer 12C of the multilayer wiring board 10D according to the present embodiment, the signal wiring 25 is placed between the power supply wirings 26. Thus, the multilayer wiring board 10D has coplanar structures. Further, a set of the signal wiring 25 formed on the first wiring layer 12A and the ground wiring 27 formed on the second wiring layer 12B, and a set of the signal wiring 25 formed on the third wiring layer 12C and the ground wiring 27 formed on the second wiring layer 12B constitute microstrip line structures.

Consequently, even in the case of the multilayer wiring board 10D according to the present embodiment, impedance matching can be achieved. Also, crosstalk can be suppressed from occurring between the signal wirings 25. Accordingly, even in the case of the multilayer wiring board 10D provided with high-density wirings, electric characteristics can be improved.

Figure 5A:
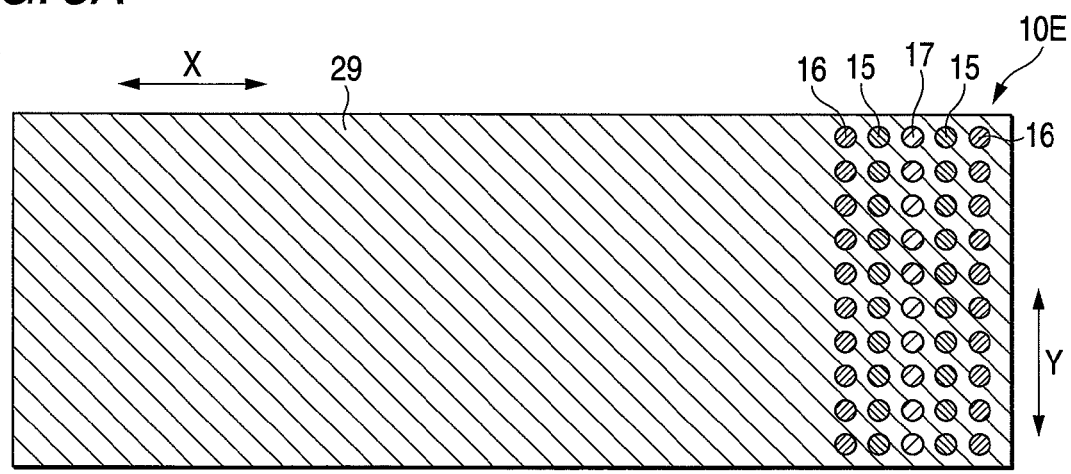
FIGS. 5A to 5D are views illustrating a multilayer wiring board according to a fifth embodiment of the invention.

FIGS. 5A to 5D illustrate a multilayer wiring board 10E that is a fifth embodiment of the invention. FIG. 5A is a plan view illustrating the multilayer wiring board 10E. As illustrated in FIG. 5A, in the multilayer wiring board 10E, the electrodes 15 to 17 connected to the semiconductor chip 101 are formed on the top surface of the first wiring layer 12A. Other parts are coated with the solder resist 29.

Figure 5B:
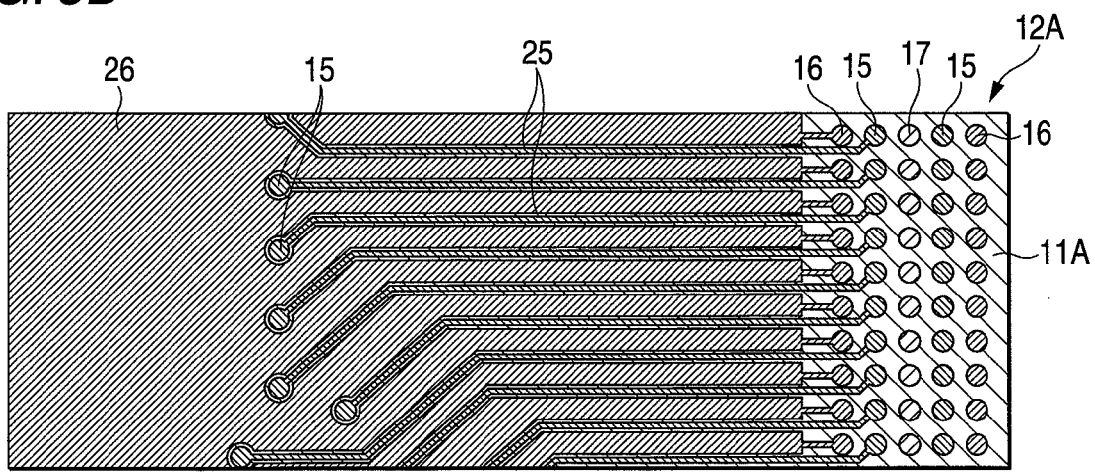

FIG. 5B illustrates a first wiring layer 12A that is a topmost layer. The innermost peripheral electrodes, the one-column-outer electrodes, the two-column-outer electrodes, the three-column-outer electrodes, and the four-column-outer electrodes are formed on the first wiring layer 12A.

The innermost peripheral electrodes include only the power supply electrodes 16. The one-column-outer electrodes include only the signal electrodes 15. The two-column-outer electrodes include only the ground electrodes 17. The three-column-outer electrodes include only the signal electrodes 15. Additionally, the four-column-outer electrodes include only the power supply electrodes 16.

The signal wirings 25 and the power supply wirings 26 are connected only to the signal electrodes 15 included by the three-column-outer electrodes and the power supply electrodes 16 included by the four-column-outer electrodes on the first wiring layer 12A. Thus, the signal wiring 25 and the power supply wiring 26 are substantially alternately formed in the orthogonal direction (i.e., Y-direction).

Figure 5C:
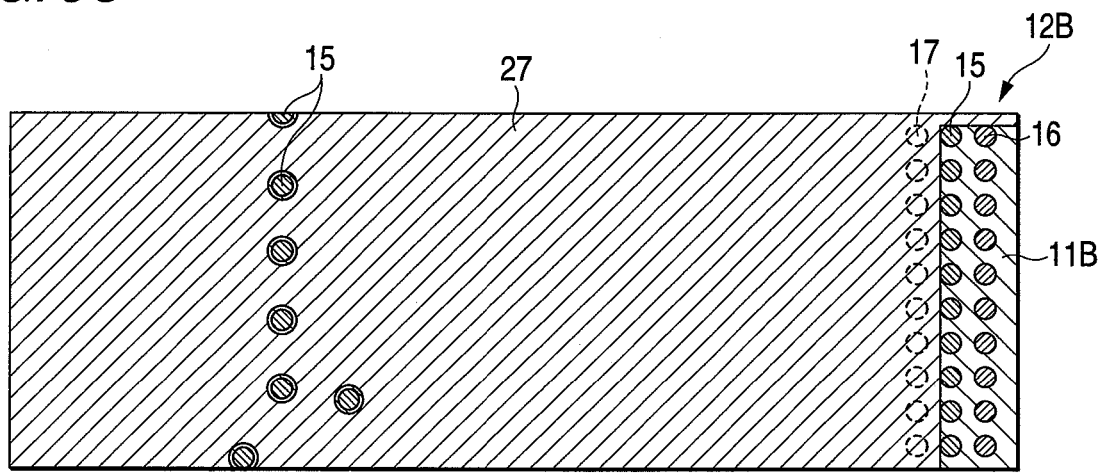

FIG. 5C illustrates the second wiring layer 12B. The second wiring layer 12B includes only the ground wiring 27. Further, a plane layer, for which the ground wiring 27 is provided, is formed. The signal electrodes 15 and the power supply electrodes 16, which serve as the innermost peripheral electrodes, are insulated from the ground electrodes 17 on a part from which the second insulating layer 11B is exposed.

Figure 5D:
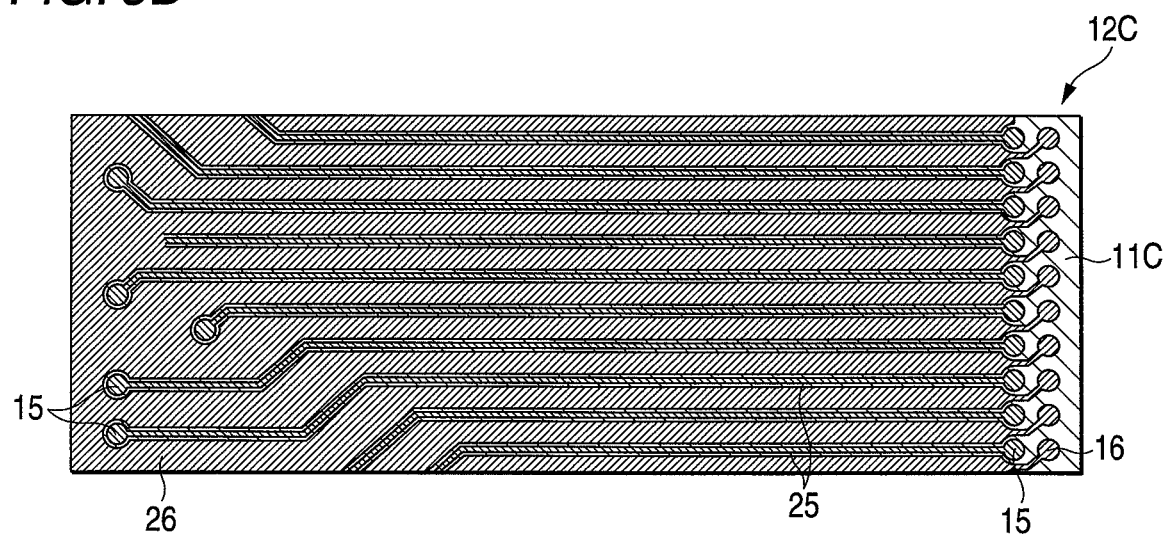

FIG. 5D illustrates the third wiring layer 12C. The signal wirings 25 and the power supply wirings 26 are connected only to the signal electrodes 15 included by the one-column-outer electrodes and the power supply electrodes 16 included by the innermost peripheral electrodes. Further, a plane layer, for which the power supply wiring 26 is provided, is formed therein. Accordingly, in the third wiring layer 12C, the signal wiring 25 and the power supply wiring 26 are substantially alternately formed in the orthogonal direction (i.e., Y-direction).

As described above, in each of the first wiring layer 12A and the third wiring layer 12C of the multilayer wiring board 10E according to the present embodiment, the signal wiring 25 is placed between the power supply wirings 26. Thus, the multilayer wiring board 10E has coplanar structures. Further, a set of the signal wiring 25 formed on the first wiring layer 12A and the ground wiring 27 formed on the second wiring layer 12B, and a set of the signal wiring 25 formed on the third wiring layer 12C and the ground wiring 27 formed on the second wiring layer 12B constitute microstrip line structures or strip line structures.

Consequently, even in the case of the multilayer wiring board 10E according to the present embodiment, impedance matching can be achieved. Also, crosstalk can be suppressed from occurring between the signal wirings 25. Accordingly, even in the case of the multilayer wiring board 10E provided with high-density wirings, electric characteristics can be improved.

Figure 6A:
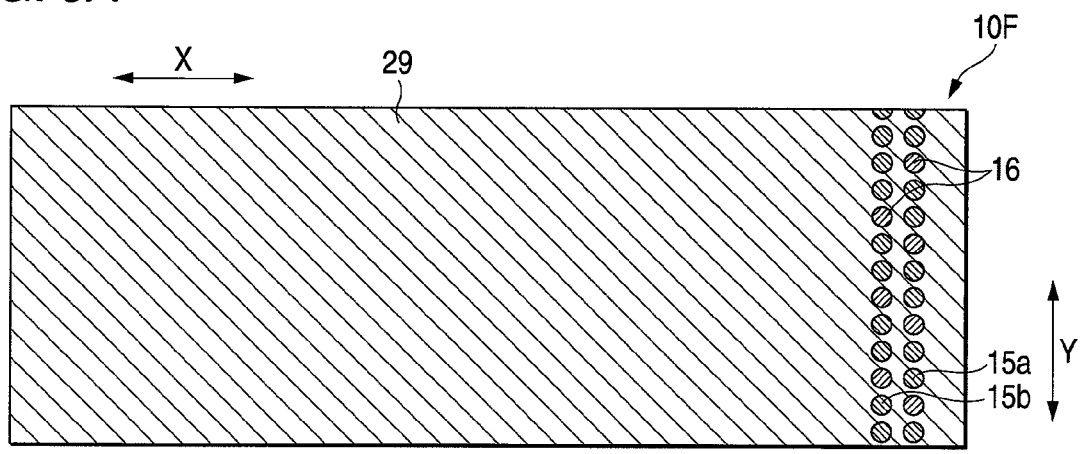
FIGS. 6A and 6B are views illustrating a multilayer wiring board according to a sixth embodiment of the invention.
Figure 6B:
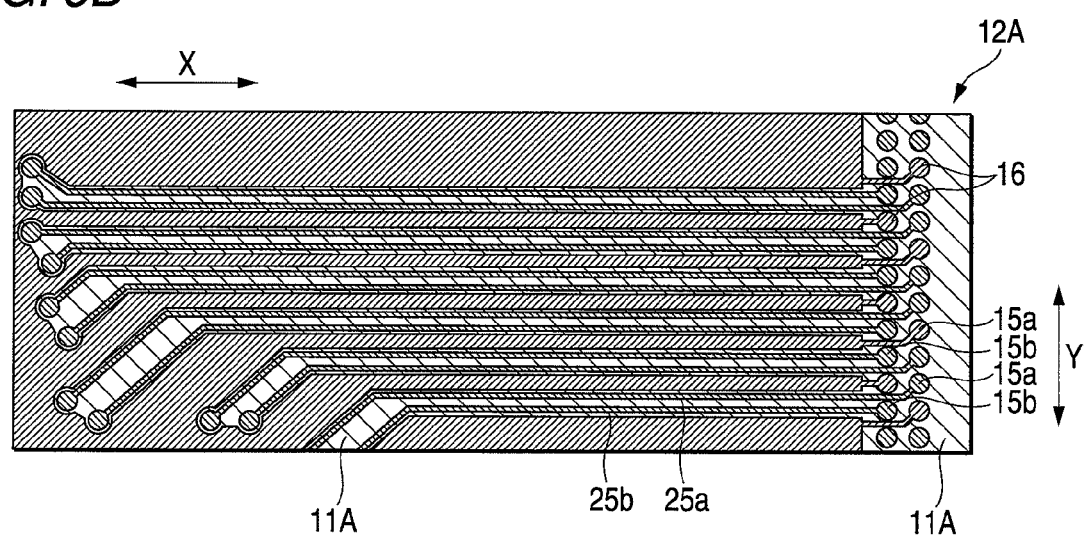

FIGS. 6A and 6B illustrate a multilayer wiring board 10F that is a sixth embodiment of the invention. FIG. 6A is a plan view illustrating the multilayer wiring board 10F. As illustrated in FIG. 6A, in the multilayer wiring board 10F, the electrodes 15a, 15b, and 16 connected to the semiconductor chip 101 are formed on the top surface of the first wiring layer 12A. Other parts are coated with the solder resist 29.

FIG. 6B illustrates a first wiring layer 12A that is a topmost layer. The innermost peripheral electrodes and the one-column-outer electrodes are formed on the first wiring layer 12A.

Signal electrodes 15a and 15b and the power supply electrodes 16 are formed as the innermost peripheral electrodes. The power supply electrode 16, the signal electrode 15b and the signal electrode 15a are formed in the orthogonal direction (i.e., Y-direction) in this order.

Also, the signal electrodes 15a and 15b and the power supply electrodes 16 are formed as the one-column-outer electrodes. The power supply electrode 16, the signal electrode 15b and the signal electrode 15a are formed in the orthogonal direction (i.e., Y-direction) in this order. Incidentally, a sequence of the electrodes included by the one-column-outer electrodes is shifted by two pitches in the orthogonal direction (i.e., Y-direction) from a sequence of the electrodes included by the innermost peripheral electrodes.

The signal electrodes 15a included by the innermost peripheral electrodes and the one-column-outer electrodes are connected to differential pair signal wires 25a on the first wiring layer 12A. The signal electrodes 15b are connected to differential pair signal wires 25b. Additionally, the power supply electrodes 16 are connected to the power supply wirings 26. The present embodiment includes the differential pair signal wire 25a and the differential pair signal wire 25b, which constitute a differential pair. Also, a plane layer, for which the power supply wiring 26 is provided, is formed. Thus, a pair of the differential pair signal wires 25a and 25b and the power supply wiring 26 are substantially alternately formed in the direction of the orthogonal direction (i.e., Y-direction). Incidentally, the second wiring layer 12B has a configuration that is substantially the same as the configuration of the first wiring layer 12A. Therefore, the illustration and the description of the second wiring layer 12B are omitted.

As described above, the multilayer wiring board 10F according to the present embodiment is configured so that the paired differential pair signal wires 25a and 25b are placed between the power supply wirings 26. Thus, the multilayer wiring board 10F has coplanar structures. Additionally, the present embodiment uses the paired differential pair signal wires 25a and 25b as signal wirings. Consequently, in accordance with the multilayer wiring board 10F according to the present embodiment, impedance matching can be achieved. Also, crosstalk can be suppressed from occurring between the differential pair signal wires 25a and 25b. Accordingly, even in the case of the multilayer wiring board 10F provided with high-density wirings, electric characteristics can be improved.

Figure 7A:
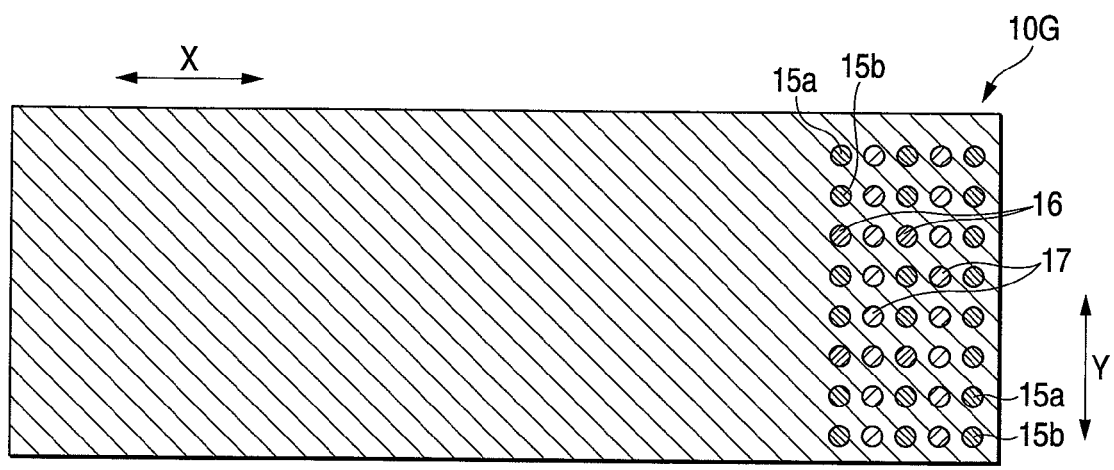
FIGS. 7A to 7D are views illustrating a multilayer wiring board according to a seventh embodiment of the invention.

FIGS. 7A to 7D illustrate a multilayer wiring board 10G that is a seventh embodiment of the invention. FIG. 7A is a plan view illustrating the multilayer wiring board 10G. As illustrated in FIG. 7A, in the multilayer wiring board 10G, the electrodes 15a, 15b, 16, and 17 connected to the semiconductor chip 101 are formed on the top surface of the first wiring layer 12A. Other parts are coated with the solder resist 29.

Figure 7B:
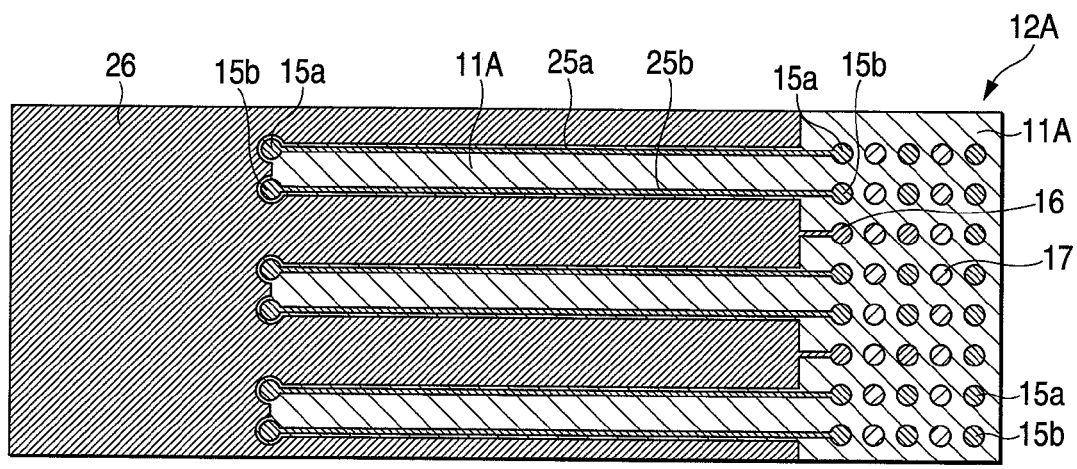

FIG. 7B illustrates a first wiring layer 12A that is a topmost layer. The innermost peripheral electrodes, the one-column-outer electrodes, the two-column-outer electrodes, the three-column-outer electrodes, and the four-column-outer electrodes are formed on the first wiring layer 12A.

The innermost peripheral electrodes include the signal electrodes 15a and 15b and the power supply electrodes 16. The one-column-outer electrodes include only the ground electrodes 17. The two-column-outer electrodes include the signal electrodes 15a and 15b and the power supply electrodes 16. The three-column-outer electrodes include only the ground electrodes 17. Additionally, the four-column-outer electrodes include the signal electrodes 15a and 15b and the power supply electrodes 16.

In the first wiring layer 12A, the signal electrode 15a included by the four-column-outer electrodes is connected to the differential pair signal wire 25a, the signal electrode 15b is connected to the differential pair signal wire 25b, and the power supply electrode 16 is connected to the power supply wiring 26. Even in the case of the present embodiment, the multilayer wiring board 10G includes the differential pair signal wire 25a and the differential pair signal wire 25b, which constitute a differential pair. Also, a plane layer, for which the power supply wiring 26 is provided, is formed. Thus, a pair of the differential pair signal wires 25a and 25b and the power supply wiring 26 are substantially alternately formed in the direction of the orthogonal direction (i.e., Y-direction).

Figure 7C:
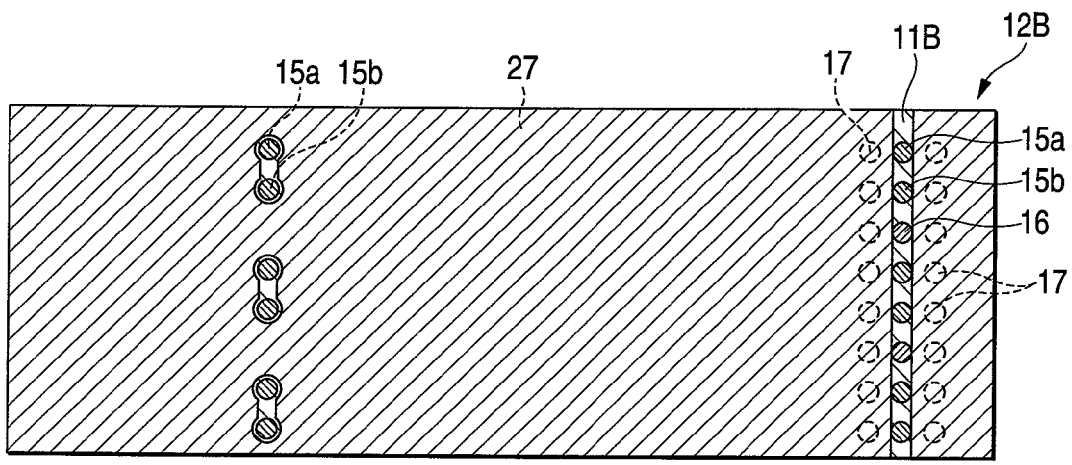

FIG. 7C illustrates the second wiring layer 12B. The second wiring layer 12B includes only the ground wiring 27. Further, a plane layer, for which the ground wiring 27 is provided, is formed. The signal electrodes 15a and 15b and the power supply electrodes 16, which serve as the innermost peripheral electrodes, are insulated from the ground electrodes 17 on a part from which the second insulating layer 11B is exposed.

Figure 7D:
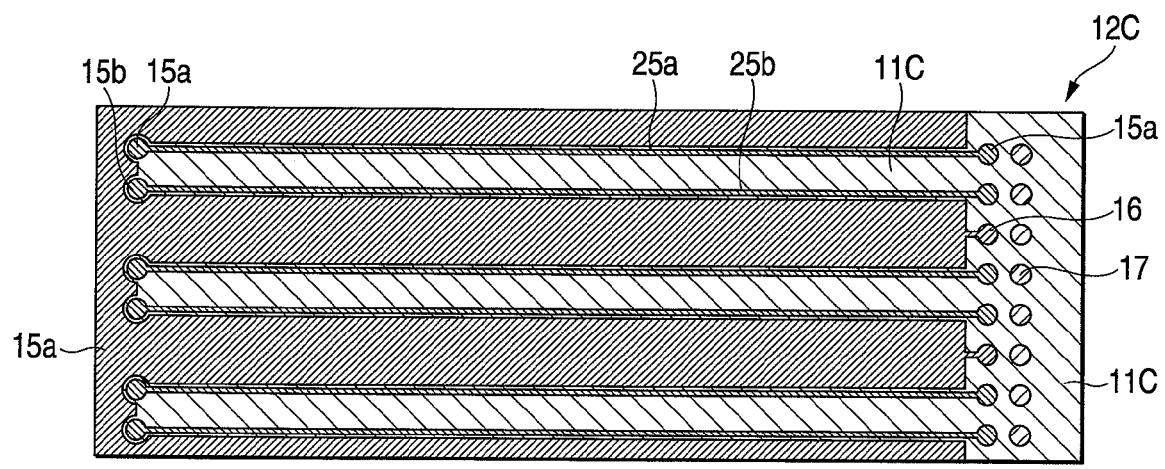

FIG. 7D illustrates the third wiring layer 12C. In the third wiring layer 12C, the signal electrode 15a included by the three-column-outer electrodes is connected to the differential pair signal wire 25a, the signal electrode 15b is connected to the differential pair signal wire 25b, and the power supply electrode 16 is connected to the power supply wiring 26. Similarly to the first wiring layer 12A, the multilayer wiring board 10G includes the differential pair signal wire 25a and the differential pair signal wire 25b, which constitute a differential pair. Also, a plane layer, for which the power supply wiring 26 is provided, is formed. Thus, a pair of the differential pair signal wires 25a and 25b and the power supply wiring 26 are substantially alternately formed in the direction of the orthogonal direction (i.e., Y-direction).

As described above, in each of the first wiring layer 12A and the third wiring layer 12C of the multilayer wiring board 10G according to the present embodiment, the signal wiring 25 is placed between the power supply wirings 26. Thus, the multilayer wiring board 10G has coplanar structures. Additionally, the present embodiment uses the paired differential pair signal wires 25a and 25b as signal wirings. Consequently, in accordance with the multilayer wiring board 10G according to the present embodiment, impedance matching can be achieved. Also, crosstalk can be suppressed from occurring between the differential pair signal wires 25a and 25b. Accordingly, even in the case of the multilayer wiring board 10G provided with high-density wirings, electric characteristics can be improved.

Incidentally, in the foregoing description of the aforementioned embodiment, it has been described that, for example, a semiconductor device is used as an electronic device, and that, for example, a multilayer wiring board is used as a high frequency use board. Objects, to which the invention is applied, are not limited to semiconductor devices. The invention can be applied to various electronic devices and high-frequency-use boards, which use high frequencies. The layout of each of the electrodes and the wirings shown in the drawings is illustrated only as an example. Apparently, the layout of each of the electrodes and the wirings is not limited to that described in the present specification.

What is claimed is:

1. A multilayer wiring board comprising:
a first wiring layer,
an insulating layer disposed under the first wiring layer,
a second wiring layer disposed under the insulating layer, and
a plurality of signal electrodes, a plurality of ground electrodes, and a plurality of power supply electrodes which are regularly formed on the first wiring layer such that the plurality of signal electrodes and the plurality of power supply electrodes are alternately formed with each other to form a first column and the plurality of ground electrodes form a second column adjacent to the first column, wherein
a plurality of signal wirings, each of the plurality of signal wirings connected to one of the plurality of signal electrodes in the first column and a plurality of power supply wirings, each of the plurality of power supply wirings connected to one of the plurality of power supply electrodes in the first column, are coplanar and are alternately provided on the insulating layer such that one of the plurality of power supply wiring is between at least two of the plurality of signal wirings, and
a ground wiring is formed as a plane layer provided in the second wiring layer as an underlayer of such that at least a portion of the plane layer is under the plurality of signal wirings and the plurality of power supply wirings and another portion is connected to the plurality of ground electrodes.

2. A multilayer wiring board comprising:
a first wiring layer,
an insulating layer disposed under the first wiring layer,
a second wiring layer disposed under the insulating layer, and
a plurality of signal electrodes, a plurality of ground electrodes, and a plurality of power supply electrodes which are regularly formed on the first wiring layer such that the plurality of signal electrodes and the plurality of power supply electrodes are alternately formed with each other to form a first column and the plurality of ground electrodes form a second column adjacent to the first column, wherein
a plurality of signal wirings and a plurality of ground wirings are coplanar and are alternately provided on the insulating layer, and
a second signal wire is formed in the second wiring layer under one of the plurality of ground wirings.

3. The multilayer wiring board according to claim 1, wherein
a wiring placed in an arranging direction just above or just below one of the at least two of the plurality of signal wirings formed on a third wiring layer disposed above the first wiring layer or on the second wiring layer is the ground wiring or the power supply wiring.

4. The multilayer wiring board according to claim 2, wherein
a wiring placed in an arranging direction just above or just below the plurality of signal wirings formed on one of the first and second wiring layers is the ground wiring or the power supply wiring.

5. A multilayer wiring board comprising:
a first wiring layer, the first wiring layer including a first plurality of signal electrodes, power supply electrodes, and ground electrodes alternately disposed and formed into a first plurality of columns, and
an insulating layer disposed under the first wiring layer,
a second wiring layer disposed under the insulating layer, the second wiring layer including a second plurality of signal electrodes, power supply electrodes, and ground electrodes alternately disposed and formed into a second plurality of columns,
a first plurality of wirings connected to outermost electrodes of the first plurality of signal electrodes, power supply electrodes, and ground electrodes formed on the first wiring layer, and
a second plurality of wirings connected to outermost electrodes of the second plurality of signal electrodes, power supply electrodes, and ground electrodes formed on the second wiring layer, wherein
one of the first plurality of wirings and the second plurality of wirings has at least two signal wirings and a power supply wiring that are coplanar and are alternately provided such that the power supply wiring is between the at least two signal wirings,
one of the first plurality of wirings and the second plurality of wirings has another signal wiring and a ground wiring that are coplanar and are alternately provided,
the first plurality of wirings and the second plurality of wirings are arranged such that the ground wiring or the power supply wiring is above or below one of the at least two signal wirings or the other signal wiring, and
a plane layer of the ground wiring is provided to be an underlayer of the signal wirings and the ground wiring.

* * * * *